US010777582B2

(12) United States Patent
Kim et al.

(10) Patent No.: US 10,777,582 B2
(45) Date of Patent: Sep. 15, 2020

(54) THIN FILM TRANSISTOR SUBSTRATE, METHOD OF MANUFACTURING THE SAME, AND METHOD OF MANUFACTURING A DISPLAY DEVICE INCLUDING THE SAME

(71) Applicants: Samsung Display Co., Ltd., Yongin-si (KR); Yonsei University Industry Foundation (Yonsei UIF), Seoul (KR)

(72) Inventors: Taesang Kim, Seoul (KR); Hyunjae Kim, Seoul (KR); Junhyung Lim, Seoul (KR); Youngjun Tak, Seoul (KR)

(73) Assignees: Samsung Display Co., Ltd., Yongin-si (KR); Yonsei University Industry Foundation (Yonsei UIF), Seoul (KR)

( * ) Notice: Subject to any disclaimer, the term of this patent is extended or adjusted under 35 U.S.C. 154(b) by 38 days.

(21) Appl. No.: 16/120,898

(22) Filed: Sep. 4, 2018

(65) Prior Publication Data

US 2019/0074303 A1    Mar. 7, 2019

(30) Foreign Application Priority Data

Sep. 5, 2017    (KR) .......................... 10-2017-0113555

(51) Int. Cl.
*H01L 27/12*    (2006.01)
*H01L 27/32*    (2006.01)
(Continued)

(52) U.S. Cl.
CPC ...... *H01L 27/1237* (2013.01); *H01L 27/1225* (2013.01); *H01L 27/2436* (2013.01);
(Continued)

(58) Field of Classification Search
CPC .................................................. H01L 27/1237
See application file for complete search history.

(56) References Cited

U.S. PATENT DOCUMENTS

| 6,294,482 B1 * | 9/2001 | Kim ...................... G02F 1/1368 |
| | | 438/770 |
| 8,148,779 B2 | 4/2012 | Jeong et al. |
| (Continued) | | |

FOREIGN PATENT DOCUMENTS

| KR | 10-2010-0002504 | 1/2010 |
| KR | 10-2013-0027190 | 3/2013 |
| KR | 10-2015-0056240 | 5/2015 |

*Primary Examiner* — William A Harriston
(74) *Attorney, Agent, or Firm* — H.C. Park & Associates, PLC

(57) ABSTRACT

A method of manufacturing a thin film transistor substrate may include forming a gate electrode on a base substrate, forming a gate insulation layer on the base substrate, the gate insulation layer covering the gate electrode, performing a simultaneous ultraviolet ray irradiation and thermal treatment (SUT) process by irradiating an ultraviolet ray at the gate insulation layer and supplying heat to the gate insulation layer at substantially the same time, forming an active pattern on the gate insulation layer, the active pattern overlapping the gate electrode, and forming a source electrode and a drain electrode on the gate insulation layer, the source electrode and the drain electrode being electrically connected to the active pattern.

17 Claims, 11 Drawing Sheets

(51) Int. Cl.
*H01L 27/24* (2006.01)
*H01L 29/786* (2006.01)
*H01L 29/49* (2006.01)
*H01L 29/66* (2006.01)
*H01L 51/50* (2006.01)

(52) U.S. Cl.
CPC ...... *H01L 27/3246* (2013.01); *H01L 29/4908* (2013.01); *H01L 29/66969* (2013.01); *H01L 29/7869* (2013.01); *H01L 51/5012* (2013.01); *H01L 27/1285* (2013.01); *H01L 2227/323* (2013.01)

(56) References Cited

U.S. PATENT DOCUMENTS

| | | |
|---|---|---|
| 8,871,577 B2 | 10/2014 | Jeong et al. |
| 9,035,313 B2 | 5/2015 | Jeong et al. |
| 9,136,342 B2 | 9/2015 | Jeong et al. |
| 9,502,246 B2 | 11/2016 | Kim et al. |
| 2009/0298226 A1* | 12/2009 | Umeda ............ H01L 21/02686 438/104 |
| 2009/0321731 A1 | 12/2009 | Jeong et al. |
| 2012/0153278 A1 | 6/2012 | Jeong et al. |
| 2013/0056828 A1 | 3/2013 | Jeong et al. |
| 2015/0008437 A1 | 1/2015 | Jeong et al. |
| 2015/0140699 A1* | 5/2015 | Kim ................ H01L 21/02565 438/23 |
| 2018/0006056 A1* | 1/2018 | Bae ................ H01L 29/41733 |

\* cited by examiner

THIN FILM TRANSISTOR SUBSTRATE, METHOD OF MANUFACTURING THE SAME, AND METHOD OF MANUFACTURING A DISPLAY DEVICE INCLUDING THE SAME

CROSS-REFERENCE TO RELATED APPLICATION

This application claims priority from and the benefit of Korean Patent Application No. 10-2017-0113555, filed on Sep. 5, 2017, which is hereby incorporated by reference for all purposes as if fully set forth herein.

BACKGROUND

Field

Exemplary embodiments of the invention relate generally to display devices. More specifically, exemplary embodiments relate to thin film transistor substrates, methods of manufacturing a thin film transistor substrate, and display devices including a thin film transistor substrate.

Discussion of the Background

A thin film transistor substrate included in a display device may include thin layers such as an insulation layer, a conductive layer, a semiconductor layer, or the like. A chemical vapor deposition (CVD) process may be performed so as to form the thin layers. When the thin layers are formed by the CVD process, which requires relatively high temperature, a selection range of base substrates may be limited or the base substrate may be deformed or damaged thereby decreasing a quality of the display device.

The above information disclosed in this Background section is only for understanding of the background of the inventive concepts, and, therefore, it may contain information that does not constitute prior art.

SUMMARY

Methods according to exemplary implementations provide a method of manufacturing a thin film transistor substrate and a method of manufacturing a display device including the thin film transistor substrate for improving a characteristic of a thin film transistor.

Devices constructed according to exemplary implementations provide a thin film transistor substrate including a thin film transistor having an improved characteristic.

A method of manufacturing a thin film transistor substrate according to an exemplary embodiment may include forming a gate electrode on a base substrate, forming a gate insulation layer on the base substrate, the gate insulation layer covering the gate electrode, performing a simultaneous ultraviolet ray irradiation and thermal treatment (SUT) process by irradiating an ultraviolet ray at the gate insulation layer and supplying heat to the gate insulation layer at substantially the same time, forming an active pattern on the gate insulation layer, the active pattern overlapping the gate electrode, and forming a source electrode and a drain electrode on the gate insulation layer, the source electrode and the drain electrode being electrically connected to the active pattern.

The SUT process may be performed after forming the gate insulation layer and before forming the active pattern.

The gate electrode, the gate insulation layer, the active pattern, the source electrode and the drain electrode may be formed by a sputtering process.

The gate insulation layer may include a first surface and a second surface opposite to each other. The ultraviolet ray may be irradiated at the first surface and the heat may be supplied to the second surface.

The SUT process may be performed at a temperature in a range of 100° C. to about 250° C.

The ultraviolet ray may have a wavelength in a range of 185 nm to 370 nm.

The SUT process may be performed for a duration in a range of 1 minute to 3 hours.

The SUT process may be performed in an oxygen atmosphere or a moisture atmosphere.

The method may further include forming an etch-stop layer on the active pattern before forming the source electrode and the drain electrode.

The method may further include forming a first electrode on the base substrate and forming the second electrode on the gate insulation layer, the second electrode overlapping the first electrode. A resistive random access memory (RRAM) may be defined by the first electrode, the gate insulation layer, and the second electrode.

The gate insulation layer may include a first region located between the gate electrode and the active pattern and a second region located between the first electrode and the second electrode. The SUT process may be performed in the first region and may not be performed in the second region.

The ultraviolet ray may be irradiated at the first region and may not be irradiated at the second region.

The first electrode may be formed together with the gate electrode, and the second electrode may be formed together with the source electrode and the drain electrode.

An exemplary embodiment of a thin film transistor substrate may include a base substrate, a gate electrode disposed on the base substrate, a gate insulation layer disposed on the base substrate and covering the gate electrode, an active pattern disposed on the gate insulation layer and overlapping the gate electrode, and a source electrode and a drain electrode disposed on the gate insulation layer and electrically connected to the active pattern. The gate insulation layer includes a first region and a second region, the first region being located between the gate electrode and the active pattern. A contact angle against a water droplet of the first region may be in a range from about 1 degree to about 40 degree.

The thin film transistor substrate may include a first electrode disposed on the base substrate and a second electrode disposed on the second region of the gate insulation layer and overlapping the first electrode. The resistive random access memory (RRAM) may be defined by the first electrode, the second region of the gate insulation layer, and the second electrode.

The contact angle against the water droplet of the first region may be less than a contact angle against a water droplet of the second region.

An amount of oxygen included in the first region may be greater than an amount of oxygen included in the second region.

An exemplary embodiment of a method of manufacturing a display device may include forming a gate electrode on a base substrate, forming a gate insulation layer on the base substrate, the gate insulation layer covering the gate electrode, performing a simultaneous ultraviolet ray irradiation and thermal treatment (SUT) process by irradiating an ultraviolet ray at the gate insulation layer and supplying heat to the gate insulation layer at substantially the same time, forming an active pattern on the gate insulation layer, the active pattern overlapping the gate electrode, forming a source electrode and a drain electrode on the gate insulation layer, the source electrode and the drain electrode being electrically connected to the active pattern, forming a pixel electrode electrically connected to the drain electrode, forming a pixel defining layer on the pixel electrode, the pixel defining layer exposing a portion of the pixel electrode, forming an organic light emitting layer on the exposed pixel electrode, and forming a common electrode on the organic light emitting layer and the pixel defining layer.

The SUT process may be performed after forming the gate insulation layer and before forming the active pattern.

The gate electrode, the gate insulation layer, the active pattern, the source electrode and the drain electrode may be formed by a sputtering process.

In the methods of manufacturing the thin film transistor substrate and the display device according to exemplary embodiments, the SUT process, which is irradiating the ultraviolet ray to the gate insulation layer and supplying the heat to the gate insulation layer at substantially the same time, may be performed thereby improving a quality of the thin film transistor.

The thin film transistor substrate according to exemplary embodiments may include the gate insulation layer having an improved insulation characteristic thereby improving a quality of the thin film transistor.

Additional features of the inventive concepts will be set forth in the description which follows, and in part will be apparent from the description, or may be learned by practice of the inventive concepts. It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
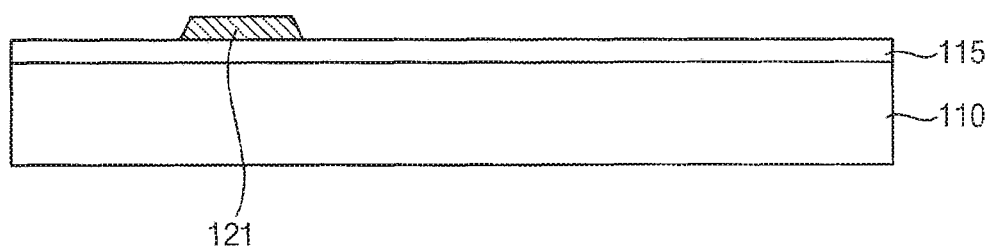
FIG. 1, FIG. 2, FIG. 3, FIG. 4, FIG. 5, and FIG. 6 are cross-sectional views illustrating a method of manufacturing a thin film transistor substrate according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular exemplary embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, thin film transistor substrates, methods of manufacturing a thin film transistor substrate, and methods of manufacturing a display device in accordance with embodiments of the present disclosure will be explained in detail with reference to the accompanying drawings.

A thin film transistor substrate and a method of manufacturing the thin film transistor substrate according to an embodiment will be explained with reference to FIGS. 1, 2, 3, 4, 5, and 6.

FIG. 1, FIG. 2, FIG. 3, FIG. 4, FIG. 5, and FIG. 6 are cross-sectional views illustrating a method of manufacturing a thin film transistor substrate according to an exemplary embodiment.

Referring to FIG. 1, a gate electrode 121 may be formed on a base substrate 110. First, the base substrate 110 may be prepared. The base substrate 110 may have flexibility. In an embodiment, the base substrate 110 may include a material having a relatively low glass transition temperature. For example, the base substrate 110 may include polycarbonate (PC), polyarylate (PAR), polyethersulfone (PES), or the like. In another embodiment, the base substrate 110 may include a material having a relatively high glass transition temperature. For example, the base substrate 110 may include polyimide (PI), or the like.

Then, a buffer layer 115 may be formed on the base substrate 110. The buffer layer 115 may prevent impurities from being diffused to the base substrate 110. The buffer layer 115 may improve a flatness of an entire surface of the base substrate 110. In other words, when the base substrate 110 has a relatively uneven top surface, the buffer layer 115 may fill in the unevenness while having a flat top surface on the base substrate 110. Alternatively, the buffer layer 115 may be omitted.

Then, a gate pattern may be formed on the buffer layer 115. The gate pattern may include a gate line (not illustrated) and a gate electrode 121 protruding from the gate line. For example, a first conductive layer may be formed on the buffer layer 115, and the first conductive layer may be etched to form the gate electrode 121.

Figure 2:
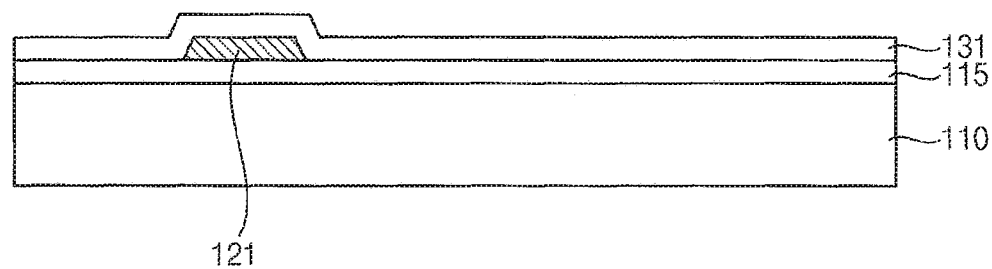

Referring to FIG. 2, a gate insulation layer 131 covering the gate electrode 121 may be formed on the base substrate 110.

In a conventional method of manufacturing a thin film transistor substrate, a gate insulation layer may be formed by a chemical vapor deposition process (e.g., a plasma enhanced chemical vapor deposition (PECVD) process). When the gate insulation layer is formed by the chemical vapor deposition process, problems such as a limited selection range of material, necessity of a relatively high processing temperature, formation of by-products after the process, or the like may occur. Specifically, in order to form a flexible thin film transistor substrate, a substrate having a relatively high glass transition temperature may be selected as a base substrate for the flexible thin film transistor substrate due to a relatively high processing temperature.

Figure 3:
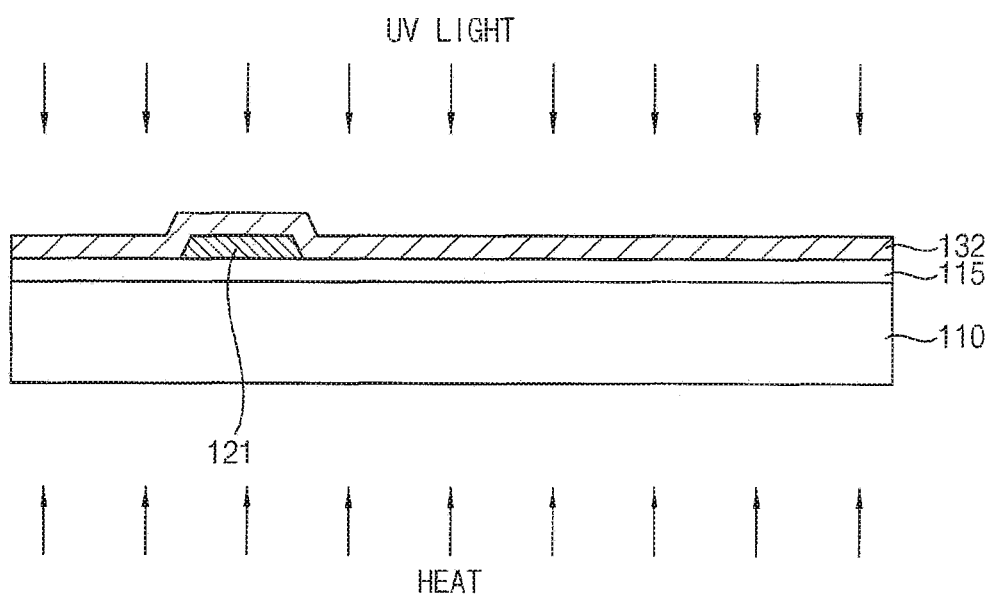

Referring to FIG. 3, a simultaneous ultraviolet ray irradiation and thermal treatment (SUT) process, which is irradiating an ultraviolet ray to the gate insulation layer 131 and supplying a heat to the gate insulation layer 131 at substantially the same time, may be performed.

In an exemplary embodiment, as illustrated in FIG. 3, the ultraviolet ray UV LIGHT may be irradiated at a top surface of the gate insulation layer 131, and the heat HEAT may be supplied to a bottom surface of the gate insulation layer 131. For example, the SUT process may be performed at a temperature from about 100 degree Celsius (° C.) to about 250° C., by using an ultraviolet ray having a wavelength from about 185 nanometers (nm) to about 370 nm, and for a duration from about 1 minute to about 3 hours. Here, the SUT process may use an ultraviolet ray emitted from an ultraviolet lamp or a short-wavelength LED. The SUT process may be performed after disposing the base substrate 110 on a hot plate or loading the base substrate 110 in a furnace. For example, the SUT process may be performed in an oxygen atmosphere or a moisture atmosphere.

In another exemplary embodiment, the ultraviolet ray UV LIGHT may be irradiated at the bottom surface of the gate insulation layer 131, and the heat HEAT may be supplied to the top surface of the gate insulation layer 131. In still another exemplary embodiment, the ultraviolet ray UV LIGHT may be irradiated at the top and bottom surfaces of the gate insulation layer 131, and the heat HEAT may be supplied to the top and bottom surfaces of the gate insulation layer 131.

A gate insulation layer 132 that is irradiated by an ultraviolet ray and thermally treated may be formed by performing the SUT process on the gate insulation layer 131. Here, the reference number 131 in FIG. 2 illustrates the gate insulation layer before being irradiated by an ultraviolet ray and thermally treated, and the reference number 132 in FIG. 3 illustrates the gate insulation layer after being irradiated by an ultraviolet ray and thermally treated. The gate insulation layer 132 may be formed at a relatively low temperature (from about 100° C. to about 250° C.) by performing the SUT process to the gate insulation layer 131.

The gate insulation layer 132, irradiated by an ultraviolet ray and thermally treated, may have a contact angle against a water droplet in a range from about 1 degree to about 40 degree. The contact angle is an angle formed when a liquid is in thermodynamic equilibrium on a solid surface and is a measure of the wettability of a solid surface. Further, the contact angle against the water droplet is the contact angle between a water droplet and a solid surface. Having a small contact angle implies displaying an excellent wettability and a high surface energy and having hydrophilicity. On the other hand, having a large contact angle implies displaying a poor wettability and a low surface energy and having hydrophobicity. When the gate insulation layer 132 has a contact angle against a water droplet in a range from about 1 degree to about 40 degree, the gate insulation layer 132 may have hydrophilicity.

The gate insulation layer 132, irradiated by an ultraviolet ray and thermally treated, may include a relatively large amount of oxygen. When the SUT process is performed, oxygen radicals having high reactivity may be consistently supplied to the gate insulation layer 132. Accordingly, a large amount of oxygen may be included in the gate insulation layer 132.

Figure 4:
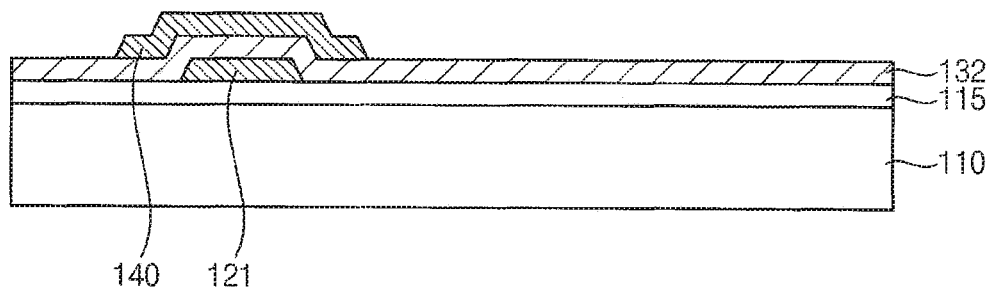

Referring to FIG. 4, an active pattern 140 overlapping the gate electrode 121 may be formed on the gate insulation layer 132. For example, a semiconductor layer may be formed on the gate insulation layer 132, and the semiconductor layer may be etched to form the active pattern 140.

The active pattern may include an oxide semiconductor, an amorphous silicon, a polysilicon, or the like. Here, the oxide semiconductor may include at least one of zinc (Zn), indium (In), gallium (Ga), tin (Sn), and a mixture thereof. For example, the oxide semiconductor may include indium-gallium-zinc oxide (IGZO).

Figure 5:
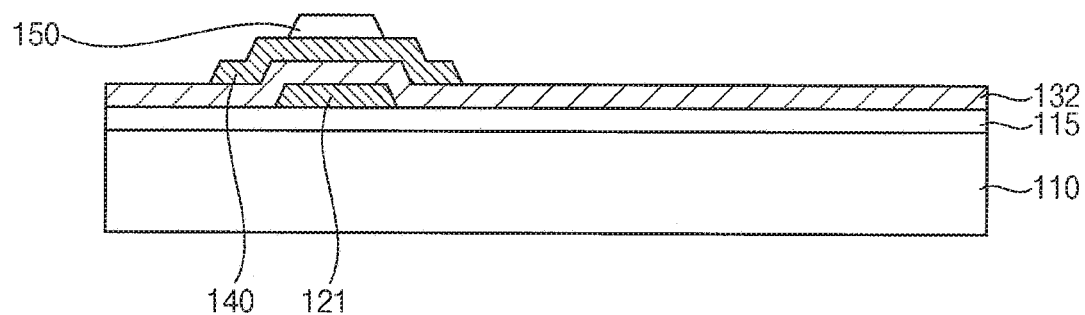

Referring to FIG. 5, an etch-stop layer 150 may be formed on the active pattern 140. For example, an insulation layer covering the active pattern 140 may be formed on the gate insulation layer 132, and the insulation layer may be etched to form the etch-stop layer 150. Here, the etch-stop layer 150 may be formed to correspond to a channel region of the active pattern 140. The etch-stop layer 150 may be located over the active pattern 140, and may prevent the active pattern 140 from being damaged during the formation of a source electrode (161 in FIG. 6) and a drain electrode (162 in FIG. 6). In an exemplary embodiment, the etch-stop layer 150 may be omitted.

The buffer layer 115, the gate insulation layer 131 and 132, and the etch-stop layer 150 may be formed of silicon compounds, metal oxide, or the like. For example, the buffer layer 115, the gate insulation layer 131 and 132, and the etch-stop layer 150 may include silicon oxide, silicon nitride, silicon oxynitride, aluminum oxide, tantalum oxide, hafnium oxide, zirconium oxide, titanium oxide, or the like. These may be used alone or in combination.

Figure 6:
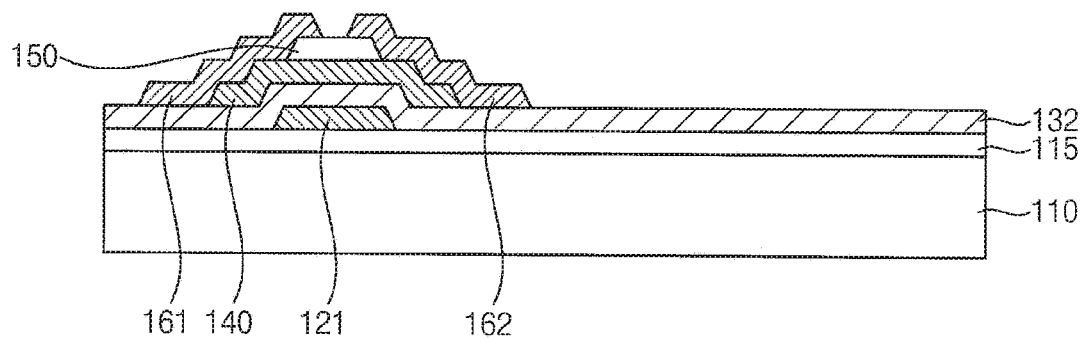

Referring to FIG. 6, a data pattern may be formed on the gate insulation layer 132. The data pattern may include a data line (not illustrated), and the source electrode 161 and the drain electrode 162 electrically connected to the active pattern 140. For example, a second conductive layer covering the active pattern 140 and the etch-stop layer 150 may be formed on the gate insulation layer 132, and the second conductive layer may be etched to form the source electrode 161 and the drain electrode 162. Here, the source electrode 161 and the drain electrode 162 may be formed to correspond to a source region and a drain region of the active pattern 140, respectively.

The gate electrode 121, the source electrode 161, and the drain electrode 162 may include metal such as aluminum, aluminum alloy, tungsten, copper, nickel, chromium, molybdenum, titanium, platinum, tantalum, ruthenium, metal alloy thereof, nitride thereof, conductive metal oxide, or the like. A thin film transistor may be defined by the gate electrode 121, the gate insulation layer 132, the active pattern 140, the source electrode 161, and the drain electrode 162.

In an exemplary embodiment, the gate electrode 121, the gate insulation layer 132, the active pattern 140, the source electrode 161, and the drain electrode 162 may be formed by a sputtering process. For example, the base substrate 110 may be disposed inside a sputtering chamber (not illustrated), and the gate electrode 121, the gate insulation layer 132, the active pattern 140, the source electrode 161, and the drain electrode 162 may be sequentially formed on the base substrate 110.

In a conventional method of manufacturing a thin film transistor substrate, a gate electrode, an active pattern, a source electrode, and a drain electrode may be formed by a sputtering process, and a gate insulation layer may be formed by a chemical vapor deposition process. In this case, after forming the gate electrode in a sputtering chamber, the gate insulation layer may be formed by moving the base substrate into a chemical vapor deposition chamber, and then, the active pattern, the source electrode, and the drain electrode may be formed by moving the base substrate into the sputtering chamber again. Therefore, a manufacturing process of the thin film transistor substrate may be complicated.

However, as explained above, according to an exemplary embodiment of the present disclosure, the gate electrode 121, the gate insulation layer 132, the active pattern 140, the source electrode 161, and the drain electrode 162 may be formed by the sputtering process, and the gate electrode 121, the gate insulation layer 132, the active pattern 140, the source electrode 161, and the drain electrode 162 may be formed in the sputtering chamber without moving the base substrate 110. Therefore, a manufacturing process of the thin film transistor substrate may be simplified.

Hereinafter, a display device and a method of manufacturing the display device according to an exemplary embodiment will be explained with reference to FIGS. 7, 8, and 9.

A display device according to an exemplary embodiment may include a thin film transistor substrate substantially the same as or similar to the thin film transistor substrate according to an exemplary embodiment. Therefore, a method of manufacturing a display device may include a manufacturing method substantially the same as or similar to the method of manufacturing a thin film transistor substrate according to an exemplary embodiment with reference to FIGS. 1 to 6. Accordingly, repeated elements of the manufacturing method may be omitted.

Figure 7:
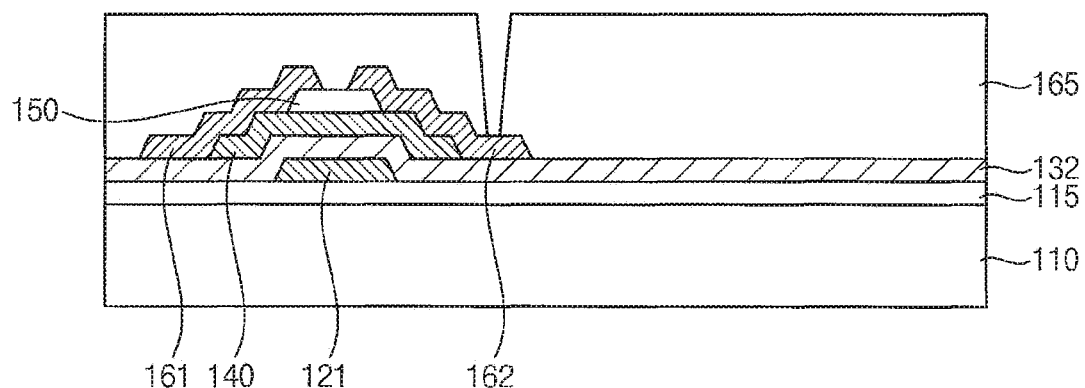
FIG. 7, FIG. 8, and FIG. 9 are cross-sectional views illustrating a method of manufacturing a display device according to an exemplary embodiment.
Figure 8:
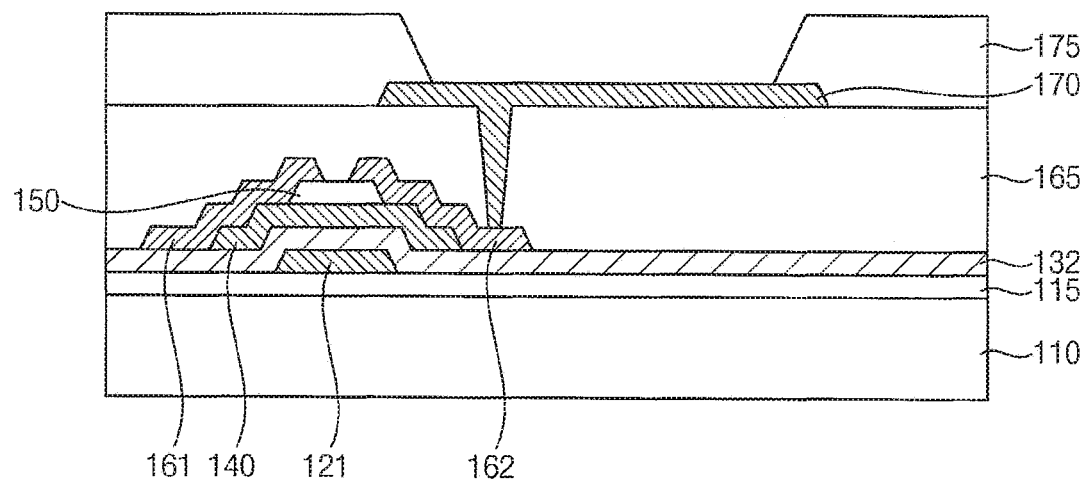
Figure 9:
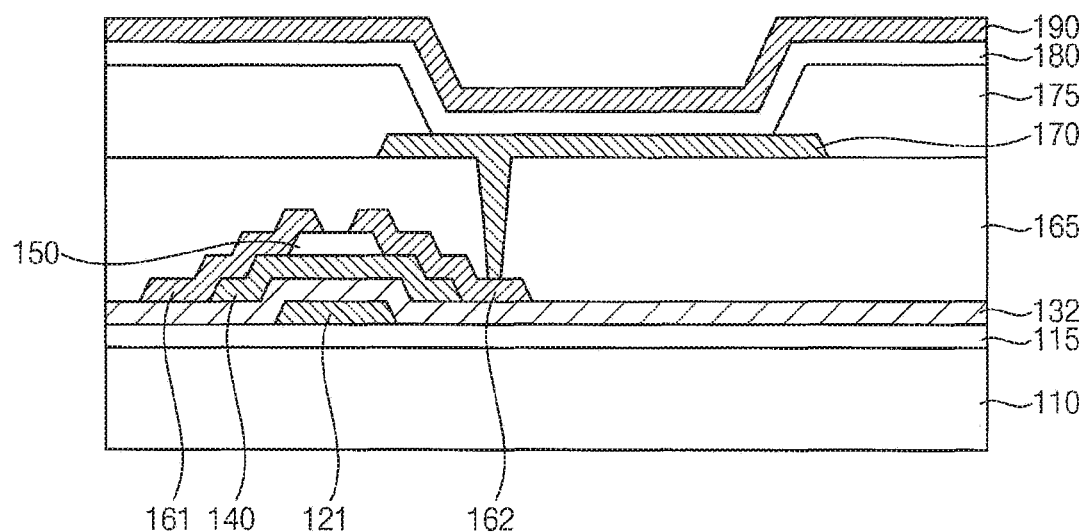

FIG. 7, FIG. 8, and FIG. 9 are cross-sectional views illustrating a method of manufacturing a display device according to an embodiment.

Referring to FIG. 7, a passivation layer 165 covering the source electrode 161 and the drain electrode 162 may be formed on the gate insulation layer 132. For example, the passivation layer 165 covering the thin film transistor may be formed on the gate insulation layer 132, and a portion of the passivation layer 165 may be etched to form a contact hole that exposes a portion of the drain electrode 162. Here, the contact hole may be formed by a photolithography process. The passivation layer 165 may include transparent insulation material.

Referring to FIG. 8, a pixel electrode 170 and a pixel defining layer 175 may be formed on the passivation layer 165. First, the pixel electrode 170, which is electrically connected to the drain electrode 162, may be formed. A pixel electrode layer may be formed on the passivation layer 165. The pixel electrode layer may fill the contact hole. The pixel electrode layer may include transparent conductive material, transflective conductive material, reflective conductive material, or the like. The pixel electrode layer may be patterned to form the pixel electrode 170 electrically connected to the drain electrode 162.

Then, the pixel defining layer 175 may be formed on the passivation layer 165 and the pixel electrode 170. The pixel defining layer 175 may include transparent insulation material. For example, the pixel defining layer 175 may include organic material such as polyacrylate based resin, polyimide based resin, or silica related inorganic material.

Then, a portion of the pixel defining layer 175 may be etched to form an opening that exposes the pixel electrode 170. The opening of the pixel defining layer 175 may have a sidewall inclined at a predetermined angle with respect to the base substrate 110. An organic light emitting layer 180 in FIG. 9 and/or a common electrode 190 in FIG. 9 may be easily formed in a following process according to the inclined angle of the opening.

Referring to FIG. 9, the organic light emitting layer 180 and the common electrode 190 may be sequentially formed on the pixel electrode 170.

First, the organic light emitting layer 180 may be formed on the pixel electrode 170, the sidewall of the opening of the pixel defining layer 175, and an upper surface of the pixel defining layer 175. The organic light emitting layer 180 may be substantially uniformly formed according to a profile of the opening on the exposed pixel electrode 170, the sidewall of the opening of the pixel defining layer 175, and the upper surface of the pixel defining layer 175. The organic light emitting layer 180 may be formed of low molecular organic material, high molecular organic material, or the like respectively emitting red light, green light and blue light. Further, the organic light emitting layer 180 may have a multi-layered structure including a light emitting layer, a hole injection layer, a hole transport layer, an electron transport layer, an electron injection layer, or the like.

Then, the common electrode 190 may be formed on the organic light emitting layer 180. The common electrode 190 may include transparent conductive material, transflective conductive material, reflective conductive material, or the like. The common electrode 190 may be substantially uniformly formed on the organic light emitting layer 180.

Hereinafter, a thin film transistor substrate and a method of manufacturing the thin film transistor substrate according to an exemplary embodiment will be explained with reference to FIGS. 10, 11, 12, and 13. Elements of the method of manufacturing a thin film transistor substrate with reference to FIGS. 10, 11, 12, and 13, which are substantially the same as or similar to those of the method of manufacturing a thin film transistor substrate with reference to FIGS. 1, 2, 3, 4, 5, and 6, may be omitted.

FIG. 10, FIG. 11, FIG. 12, and FIG. 13 are cross-sectional views illustrating a method of manufacturing a thin film transistor substrate according to an exemplary embodiment.

Figure 10:
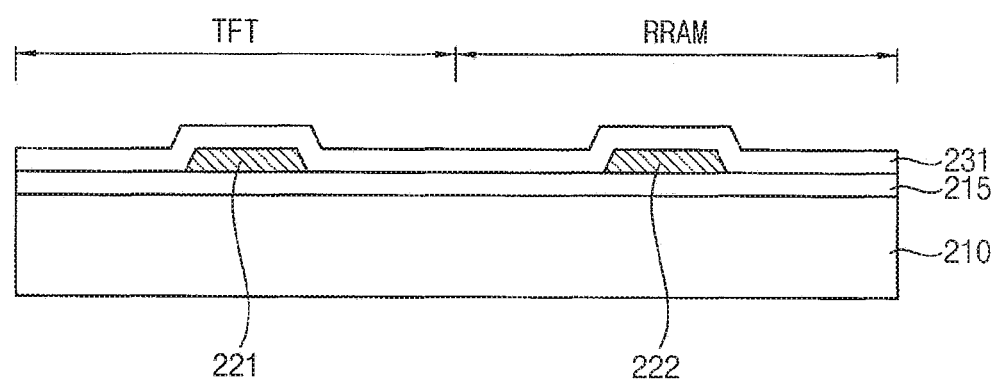
FIG. 10, FIG. 11, FIG. 12, and FIG. 13 are cross-sectional views illustrating a method of manufacturing a thin film transistor substrate according to an exemplary embodiment.

Referring to FIG. 10, a gate insulation layer 231 covering a gate electrode 211 and a first electrode 222 may be formed on a base substrate 210. First, the base substrate 210 may be prepared. The base substrate 210 may include a thin film transistor region TFT and a resistive random access memory region RRAM. A thin film transistor may be disposed in the thin film transistor region TFT, and a resistive random access memory may be disposed in the resistive random access memory region RRAM.

Then, a buffer layer 215 may be formed on the base substrate 210, and a gate pattern may be formed on the buffer layer 215. The gate pattern may include the gate electrode 221 and the first electrode 222. The gate electrode 221 may be located in the thin film transistor region TFT, and the first electrode 22 may be located in the resistive random access memory region RRAM.

In an exemplary embodiment, the gate electrode 221 and the first electrode 222 may be simultaneously formed. For example, a first conductive layer may be formed on the buffer layer 215, and the first conductive layer may be etched to simultaneously form the gate electrode 221 and the first electrode 222.

Then, the gate insulation layer 231 covering the gate electrode 221 and the first electrode 222 may be formed on the buffer layer 215.

Figure 11:
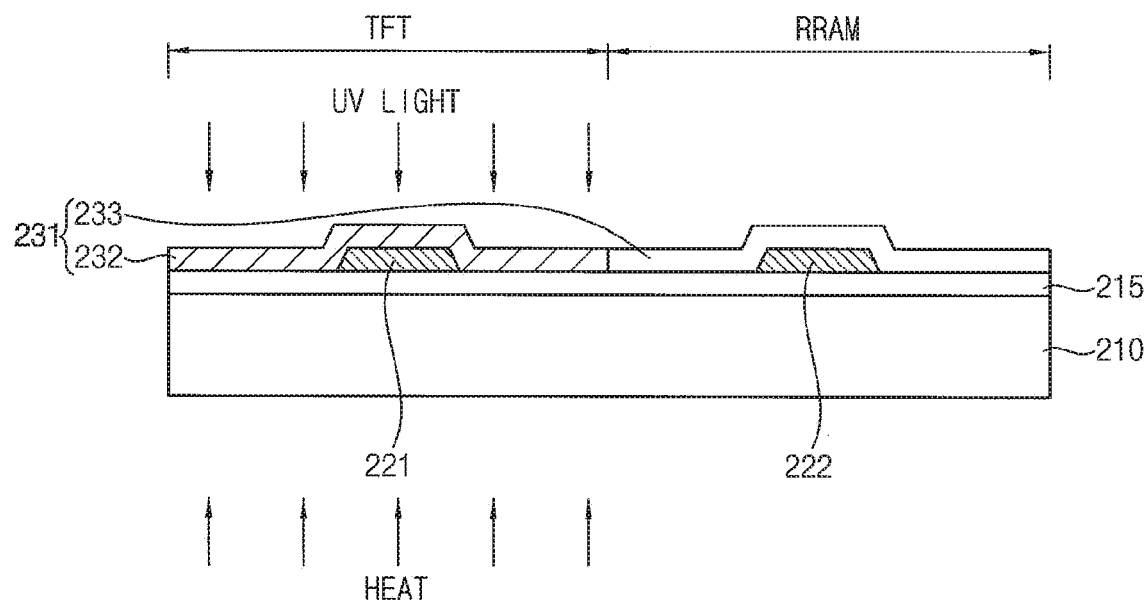

Referring to FIG. 11, a simultaneous ultraviolet ray irradiation and thermal treatment (SUT) process, which is irradiating an ultraviolet ray at the gate insulation layer 231 and supplying heat to the gate insulation layer 231 at substantially the same time, may be performed.

The SUT process may be only performed in a first region 232 of the gate insulation layer 231, and may not be performed in a second region 233 of the gate insulation layer 231. Here, the first region 232 may correspond to the thin film transistor region TFT, and the second region 233 may correspond to the resistive random access memory region RRAM.

In an exemplary embodiment, the ultraviolet ray may be irradiated at the first region 232, and may not be irradiated at the second region 233. For example, a mask (not illustrated) including an opening portion and a blocking portion may be disposed over the gate insulation layer 231, and the ultraviolet ray may be irradiated at the gate insulation layer 231 through the mask. Here, the opening portion may be located to correspond to the first region 232, and the blocking portion may be located to correspond to the second region 233. In this case, an ultraviolet ray irradiated at the first region 232 may pass through the opening portion, and an ultraviolet ray irradiated at the second region 233 may be blocked by the blocking portion.

An amount of oxygen included in the first region 232 may be greater than an amount of oxygen included in the second region 233. When the SUT process is performed to a thin film, oxygen radicals may be consistently supplied to the thin film. Accordingly, the oxygen radicals may be supplied to the first region 232 to which the SUT process is performed thereby increasing the amount of oxygen of the first region 232.

A contact angle against a water droplet of the first region 232 may be less than contact angle against a water droplet of the second region 233. When an amount of oxygen included in a thin film increases, a surface of the thin film may have hydrophilicity. Accordingly, the first region 232 to which the SUT process is performed may be relatively hydrophilic, and the contact angle against the water droplet of the first region 232 may decrease. For example, the contact angle against the water droplet of the first region 232 may be in a range from about 1 degree to about 40 degree, and the contact angle against the water droplet of the second region 233 may be in a range from about 40 degree to about 90 degree.

Figure 12:
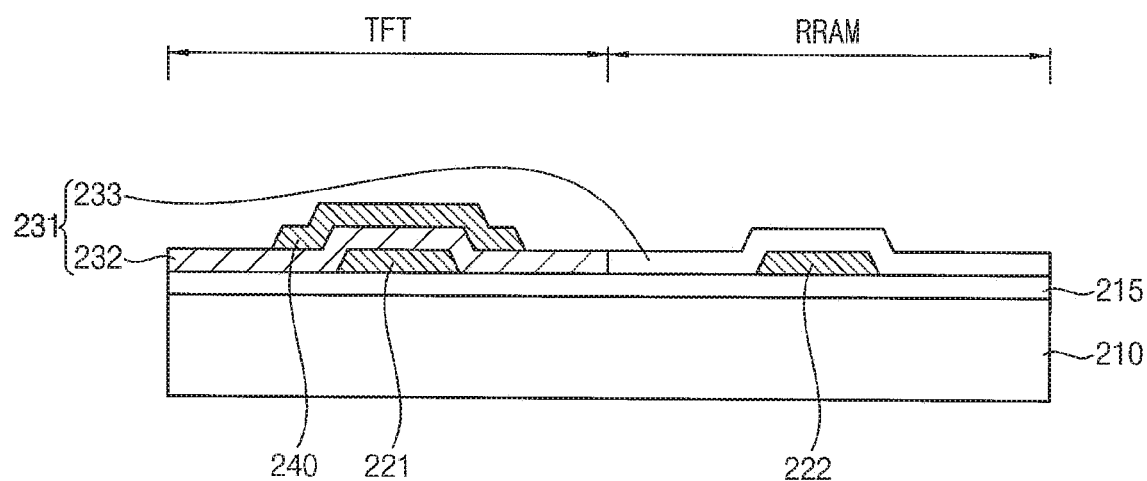

Referring to FIG. 12, an active pattern 240 overlapping the gate electrode 221 may be formed on the first region 232 of the gate insulation layer 231. The active pattern 240 may be located in the thin film transistor region TFT. Accordingly, the first region 232 may be located between the gate electrode 221 and the active pattern 240.

Figure 13:
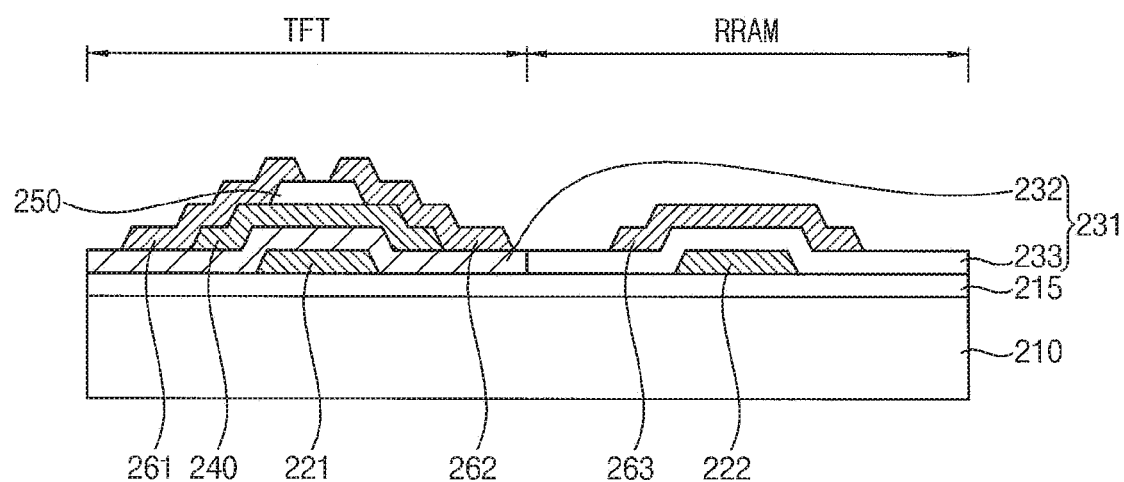

Referring to FIG. 13, a data pattern may be formed on the first region 232 and the second region 233 of the gate insulation layer 231. The data pattern may include a source electrode 261 and a drain electrode 262 electrically connected to the active pattern 240, and a second electrode 263 overlapping the first electrode 222. The source electrode 261 and the drain electrode 262 may be located in the thin film transistor region TFT, and the second electrode 263 may be located in the resistive random access memory region RRAM. Accordingly, the second region 233 may be located between the first electrode 222 and the second electrode 263.

In an exemplary embodiment, the source electrode 261, the drain electrode 262, and the second electrode 263 may be simultaneously formed. For example, a second conductive layer may be formed on the first region 232 and the second region 233 of the gate insulation layer 231, and the second conductive layer may be etched to simultaneously form the source electrode 261, the drain electrode 262, and the second electrode 263. The thin film transistor may be defined by the gate electrode 221, the first region 232 of the gate insulation layer 231, the active pattern 240, the source electrode 261, and the drain electrode 262. Further, the resistive random access memory may be defined by the first electrode 222, the second region 233 of the gate insulation layer 231, and the second electrode 263.

In an exemplary embodiment, the resistive random access memory may be located inside a pixel region of the thin film transistor substrate, and may compose a pixel circuit together with the thin film transistor. In this case, a pixel may include the thin film transistor and a memory, so that a display device may consume relatively low power when displaying a still image. In another embodiment, the resistive random access memory may be located in a driving region of the thin film transistor substrate which includes a driving circuit to drive the pixel.

Hereinafter, a thin film transistor substrate and a method of manufacturing a thin film transistor substrate according to an exemplary embodiment will be explained with reference to FIGS. 14, 15, 16, 17, and 18. Elements of the method of manufacturing a thin film transistor substrate with reference to FIGS. 14, 15, 16, 17, and 18, which are substantially the same as or similar to those of the method of manufacturing a thin film transistor substrate with reference to FIGS. 1, 2, 3, 4, 5, and 6, may be omitted.

FIG. 14, FIG. 15, FIG. 16, FIG. 17, and FIG. 18 are cross-sectional views illustrating a method of manufacturing a thin film transistor substrate according to an exemplary embodiment.

Figure 14:
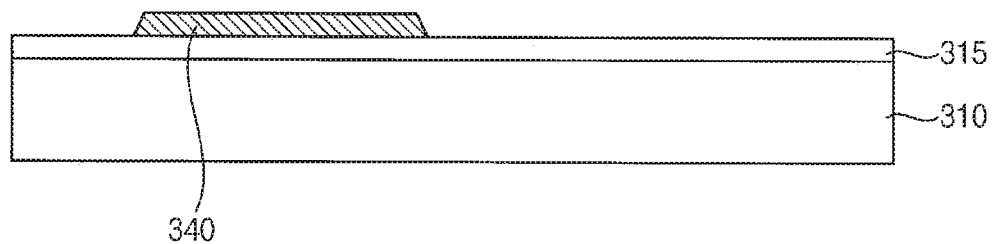
FIG. 14, FIG. 15, FIG. 16, FIG. 17, and FIG. 18 are cross-sectional views illustrating a method of manufacturing a thin film transistor substrate according to an exemplary embodiment.

Referring to FIG. 14, an active pattern 340 may be formed on the base substrate 310. First, the base substrate 310 may be prepared. Then, a buffer layer 315 may be formed on the base substrate 310. Then, the active pattern 340 may be formed on the buffer layer 315. For example, a semiconductor layer may be formed on the buffer layer 315, and the semiconductor layer may be etched to form the active pattern 340.

Figure 15:
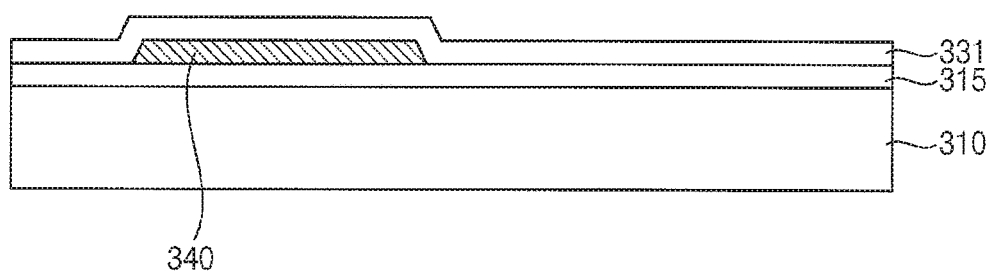

Referring to FIG. 15, a gate insulation layer 331 covering the active pattern 340 may be formed on the base substrate 310.

Figure 16:
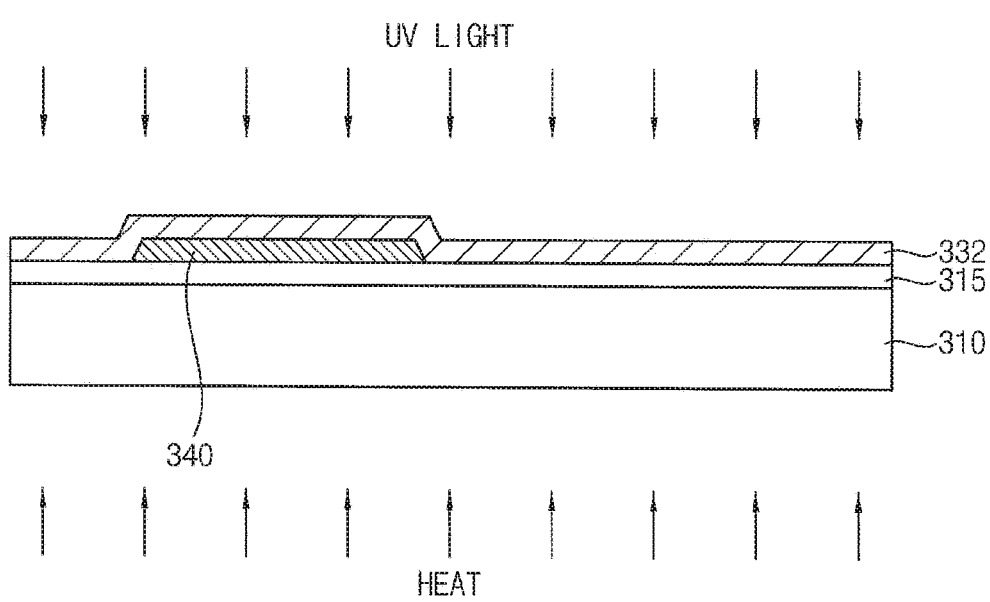

Referring to FIG. 16, a simultaneous ultraviolet ray irradiation and thermal treatment (SUT) process, which is irradiating an ultraviolet ray at the gate insulation layer 331 and supplying heat to the gate insulation layer 331 at substantially the same time, may be performed. A gate insulation layer 332 irradiated by an ultraviolet ray and thermally treated may be formed by performing the SUT process on the gate insulation layer 331.

Figure 17:
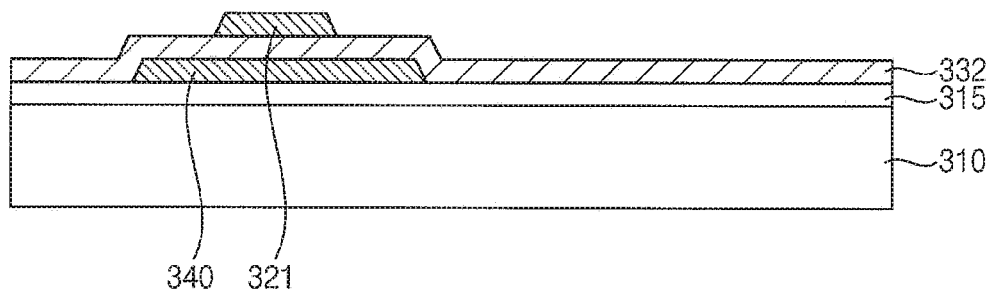

Referring to FIG. 17, a gate electrode 321 overlapping the active pattern 340 may be formed on the gate insulation layer 332. For example, a first conductive layer may be formed on the gate insulation layer 332, and the first conductive layer may be etched to form the gate electrode 321.

Figure 18:
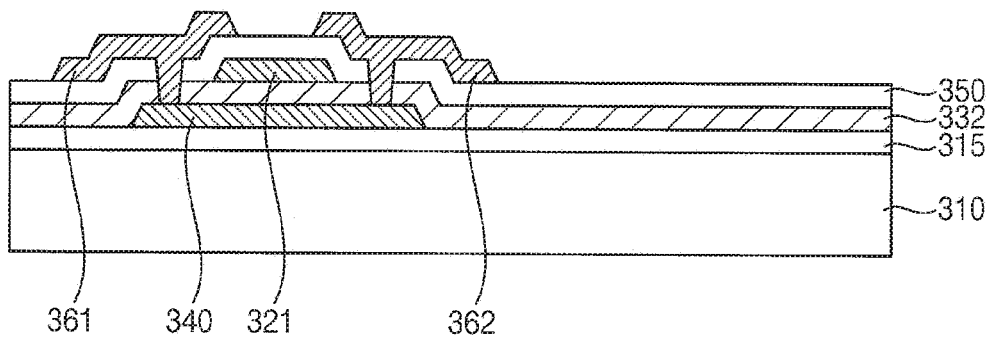

Referring to FIG. 18, a source electrode 361 and a drain electrode 362 electrically connected to the active pattern 340 may be formed on the gate insulation layer 332. First, an insulation interlayer 350 covering the gate electrode 321 may be formed on the gate insulation layer 332. The insulation interlayer 350 may include a material substantially the same as or similar to that of the etch-stop layer 150 aforementioned.

Then, the insulation interlayer 350 and the gate insulation layer 332 may be partially etched to form contact holes respectively exposing portions of the active pattern 340. Then, the source electrode 361 and the drain electrode 362 electrically connected to the active pattern 340 may be formed on the insulation interlayer 350. For example, a second conductive layer filling the contact holes may be formed on the insulation interlayer 350, and the second conductive layer may be etched to form the source electrode 361 and the drain electrode 362.

Hereinafter, characteristics of a thin film transistor substrate according to an embodiment may be explained with reference to FIGS. 19A, 19B, 20A, and 20B and Table 1.

Figure 19A:
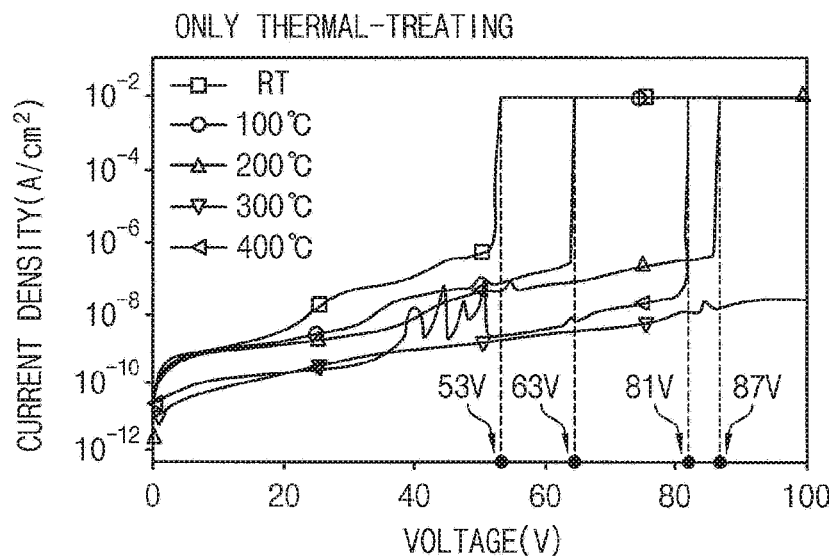
FIG. 19A illustrates a relationship between a voltage and a current density of a thin film transistor according to a manufacturing temperature when only thermally treating the gate insulation layer.
Figure 19B:
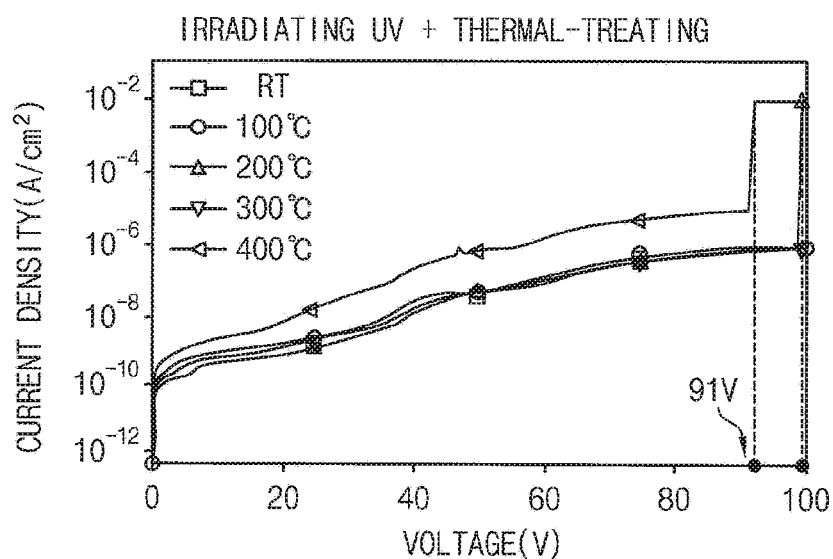
FIG. 19B illustrates a relationship between a voltage and a current density of a thin film transistor according to a manufacturing temperature when irradiating an ultraviolet ray at and thermally treating the gate insulation layer at substantially the same time.

FIG. 19A illustrates a relationship between a voltage and a current density of a thin film transistor according to a manufacturing temperature when only thermally treating the gate insulation layer. FIG. 19B illustrates a relationship between a voltage and a current density of a thin film transistor according to a manufacturing temperature when irradiating an ultraviolet ray at and thermally treating the gate insulation layer at substantially the same time.

Referring to FIGS. 19A and 19B, a breakdown voltage of the thin film transistor to which an ultraviolet ray is irradiated and a heat is supplied simultaneously is greater than that of the thin film transistor to which a heat is supplied only. Further, when the gate insulation layer is irradiated by an ultraviolet ray and thermal-treated simultaneously, the breakdown voltage is lowered at 400° C. Accordingly, an insulation characteristic of the thin film transistor may be improved when the gate insulation layer is irradiated by an ultraviolet ray and thermally treated simultaneously. A temperature of the SUT process may be appropriate at a range from about 100° C. to about 300° C. (preferably, from about 100° C. to about 250° C.).

Figure 20A:
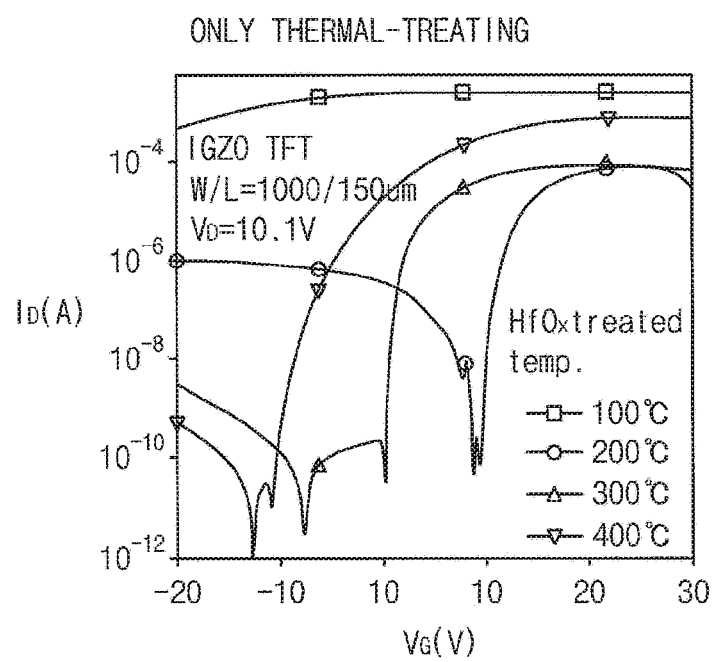
FIG. 20A illustrates a relationship between a voltage $V_G$ and a current $I_D$ of a thin film transistor according to a manufacturing temperature when only thermally treating the gate insulation layer.
Figure 20B:
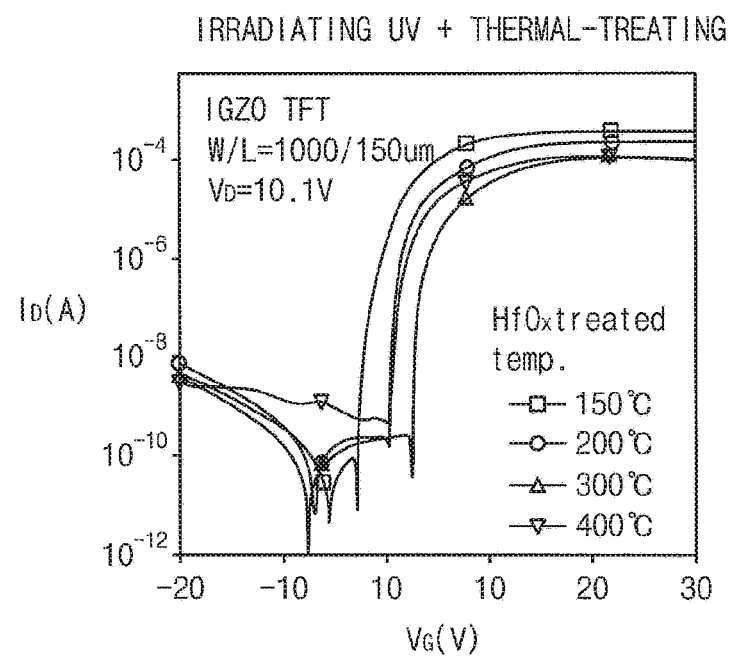
FIG. 20B illustrates a relationship between a voltage $V_G$ and a current $I_D$ of a thin film transistor according to a manufacturing temperature when irradiating an ultraviolet ray at and thermally treating the gate insulation layer at substantially the same time.

FIG. 20A illustrates a relationship between a voltage $V_G$ and a current $I_D$ of a thin film transistor according to a manufacturing temperature when only thermally treating the gate insulation layer. FIG. 20B illustrates a relationship between a voltage $V_G$ and a current $I_D$ of a thin film transistor according to a manufacturing temperature when irradiating an ultraviolet ray at and thermally treating the gate insulation layer at substantially the same time. Further, Table 1 illustrates a transfer characteristic of the thin film transistor of the thin film transistor substrate.

TABLE 1

|  | electron mobility (cm²/Vs) | sub-threshold swing (V/dec) | on/off ratio |
|---|---|---|---|
| only thermal-treated (300° C.) | 6.24 | 0.44 | $2.56 \times 10^7$ |
| SUT (150° C.) | 32.72 | 0.42 | $7.76 \times 10^7$ |
| SUT (200° C.) | 15.41 | 0.45 | $3.18 \times 10^7$ |

Referring to FIG. 20, a transfer characteristic of the thin film transistor improves when simultaneously irradiating an ultraviolet ray to and thermally treating the gate insulation layer in comparison with when only thermally treating the gate insulation layer is used. Further, referring to Table 1, an electron mobility and an on/off ratio of the thin film transistor is relatively high and a sub-threshold swing of the thin film transistor is relatively low when simultaneously irradiating an ultraviolet ray to and thermally treating the gate insulation layer at a temperature 150° C. or 200° C. in comparison with when only thermal-treating the gate insulation layer at a temperature 300° C. Accordingly, a transfer characteristic of the thin film transistor may be improved when the gate insulation layer is irradiated by an ultraviolet ray and thermally treated simultaneously. A temperature of the SUT process may be appropriate in a range from about 100° C. to about 250° C.

The thin film transistor substrate and the display device according to exemplary embodiments of the present disclosure may be applied to a display device included in a computer, a notebook, a mobile phone, a smartphone, a smart pad, a PMP, a PDA, an MP3 player, or the like.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A method of manufacturing a thin film transistor substrate, the method comprising:
   forming a gate electrode on a base substrate;
   forming a gate insulation layer on the base substrate, the gate insulation layer covering the gate electrode;
   performing a simultaneous ultraviolet ray irradiation and thermal treatment (SUT) process by irradiating an ultraviolet ray at the gate insulation layer and supplying heat to the gate insulation layer at substantially the same time;
   forming an active pattern on the gate insulation layer, the active pattern overlapping the gate electrode; and
   forming a source electrode and a drain electrode on the gate insulation layer, the source electrode and the drain electrode being electrically connected to the active pattern,
   wherein the SUT process is performed after forming the gate insulation layer and before forming the active pattern.

2. The method of claim 1, wherein the gate electrode, the gate insulation layer, the active pattern, the source electrode, and the drain electrode are formed by a sputtering process.

3. The method of claim 1, wherein the gate insulation layer comprises a first surface and a second surface opposite to each other, and
   wherein the ultraviolet ray is irradiated at the first surface and the heat is supplied to the second surface.

4. The method of claim 1, wherein the SUT process is performed at a temperature in a range of 100° C. to 250° C.

5. The method of claim 1, wherein the ultraviolet ray has a wavelength in a range of 185 nm to 370 nm.

6. The method of claim 1, wherein the SUT process is performed for a duration in a range of 1 minute to 3 hours.

7. The method of claim 1, wherein the SUT process is performed in an oxygen atmosphere.

8. The method of claim 1, further comprising forming an etch-stop layer on the active pattern before forming the source electrode and the drain electrode.

9. The method of claim 1, further comprising:
   forming a first electrode on the base substrate; and
   forming a second electrode on the gate insulation layer, the second electrode overlapping the first electrode,
   wherein a resistive random access memory is defined by the first electrode, the gate insulation layer, and the second electrode.

10. The method of claim 9, wherein the gate insulation layer comprises a first region located between the gate electrode and the active pattern and a second region located between the first electrode and the second electrode, and
    wherein the SUT process is performed in the first region and is not performed in the second region.

11. The method of claim 10, wherein the ultraviolet ray is irradiated at the first region and is not irradiated at the second region.

12. The method of claim 9, wherein the first electrode is formed together with the gate electrode, and wherein the second electrode is formed together with the source electrode and the drain electrode.

13. A thin film transistor substrate, comprising:
a base substrate;
a gate electrode disposed on the base substrate;
a first electrode disposed on the base substrate;
a gate insulation layer disposed on the base substrate and covering the gate electrode;
an active pattern disposed on the gate insulation layer and overlapping the gate electrode;
a source electrode and a drain electrode disposed on the gate insulation layer and electrically connected to the active pattern; and
a second electrode disposed the gate insulation layer and overlapping the first electrode,
wherein the gate insulation layer comprises a first region and a second region, the first region being located between the gate electrode and the active pattern and the second region comprising the second electrode,
wherein a contact angle against a water droplet of the first region is in a range from 1 degree to 40 degree, and
wherein a resistive random access memory is defined by the first electrode, the second region of the gate insulation layer, and the second electrode.

14. The thin film transistor substrate of claim 13, wherein the contact angle against the water droplet of the first region is less than a contact angle against a water droplet of the second region.

15. The thin film transistor substrate of claim 13, wherein an amount of oxygen included in the first region is greater than an amount of oxygen included in the second region.

16. A method of manufacturing a display device, the method comprising:
forming a gate electrode on a base substrate;
forming a gate insulation layer on the base substrate, the gate insulation layer covering the gate electrode;
performing a simultaneous ultraviolet ray irradiation and thermal treatment (SUT) process by irradiating an ultraviolet ray at the gate insulation layer and supplying heat to the gate insulation layer at substantially the same time;
forming an active pattern on the gate insulation layer, the active pattern overlapping the gate electrode;
forming a source electrode and a drain electrode on the gate insulation layer, the source electrode and the drain electrode being electrically connected to the active pattern;
forming a pixel electrode electrically connected to the drain electrode;
forming a pixel defining layer on the pixel electrode, the pixel defining layer exposing a portion of the pixel electrode;
forming an organic light emitting layer on the exposed pixel electrode; and
forming a common electrode on the organic light emitting layer and the pixel defining layer,
wherein the SUT process is performed after forming the gate insulation layer and before forming the active pattern.

17. The method of claim 16, wherein the gate electrode, the gate insulation layer, the active pattern, the source electrode, and the drain electrode are formed by a sputtering process.

* * * * *